United States Patent [19]

Kasahara et al.

[11] Patent Number: 4,705,390
[45] Date of Patent: Nov. 10, 1987

[54] ORIGINALS PATCHING DEVICE

[75] Inventors: Shuhei Kasahara, Hirakata; Mochisuke Hiroshima, Kyoto, both of Japan

[73] Assignee: Dainippon Screen Mfg. Co., Ltd., Kyoto, Japan

[21] Appl. No.: 910,288

[22] Filed: Sep. 17, 1986

Related U.S. Application Data

[63] Continuation of Ser. No. 596,532, Apr. 4, 1984, abandoned.

[30] Foreign Application Priority Data

Apr. 25, 1983 [JP] Japan .................................. 58-72679

[51] Int. Cl.$^4$ ............................................. G03B 27/68
[52] U.S. Cl. ....................................... 355/52; 355/72; 355/75
[58] Field of Search ............................. 355/52, 72, 75

[56] References Cited

U.S. PATENT DOCUMENTS

| 2,549,699 | 4/1951 | McLaughlin et al. | 355/52 |
| 3,374,724 | 3/1968 | Torres | 355/52 |
| 3,401,616 | 9/1968 | Cross | 355/52 |

FOREIGN PATENT DOCUMENTS

| 54-100802 | 8/1979 | Japan . |
| 54-27253 | 9/1979 | Japan . |
| 56-107230 | 8/1981 | Japan . |
| 908431 | 10/1962 | United Kingdom . |
| 1149203 | 4/1969 | United Kingdom . |
| 2059627 | 4/1981 | United Kingdom . |
| 2065906 | 7/1981 | United Kingdom . |
| 1596836 | 9/1981 | United Kingdom . |
| 1596846 | 9/1981 | United Kingdom . |

OTHER PUBLICATIONS

IBM Technical Disclosure Bulletin, vol. 22, No 10, Mar. 1980, "Low-Cost Drum with Replaceable Photoconductor".

Primary Examiner—Monroe H. Hayes
Attorney, Agent, or Firm—Brumbaugh, Graves, Donohue & Raymond

[57] ABSTRACT

An original patching up device including a projector which projects a focused image corresponding to an image on an original carrier having a reference side while continuously changing projection magnification, a layout sheet holding arm which holds a block copy layout sheet on a reference side parallel to the reference side of the original carrier and which moves within a plane parallel to a projection surface of the projector, an original holder provided at the other side parallel to the reference side of the layout sheet holding arm, and a mechanism which can hold the transparent sheet on the same plane as the projection surface of the projector to the reference side of the layout sheet holding arm so as to transfer the original on the original carrier onto the transparent sheet keeping a relative angle between the original and an image on the block copy layout sheet.

3 Claims, 21 Drawing Figures

FIG.1
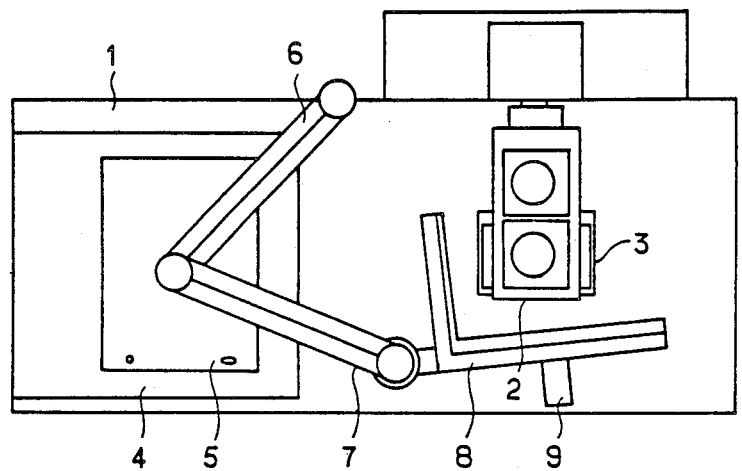
FIG.2-A
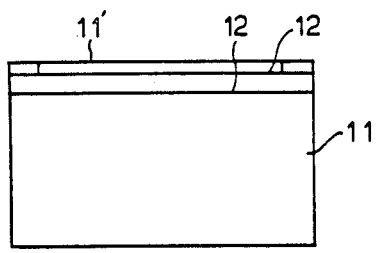
FIG.2-B
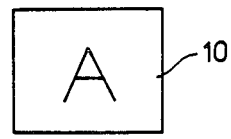
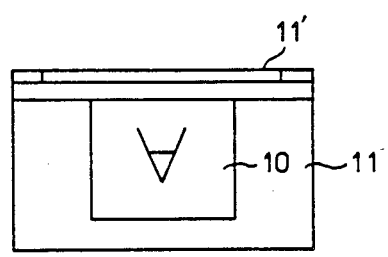
FIG.2-C

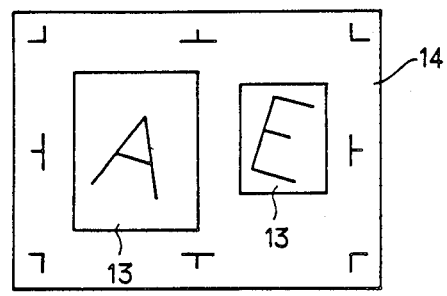
FIG. 3
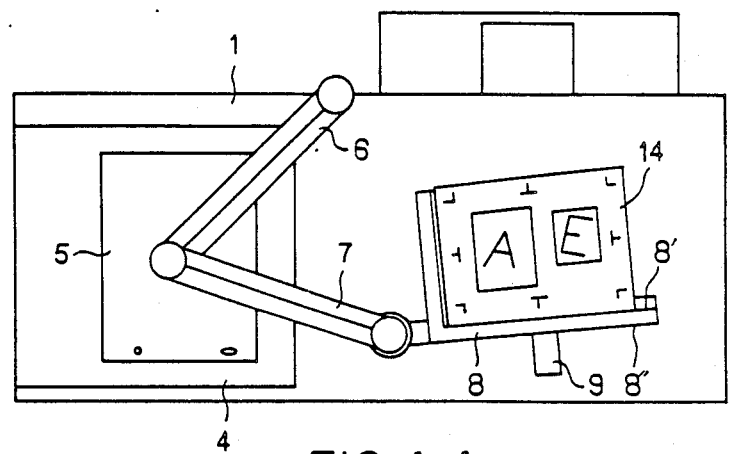
FIG. 4-A
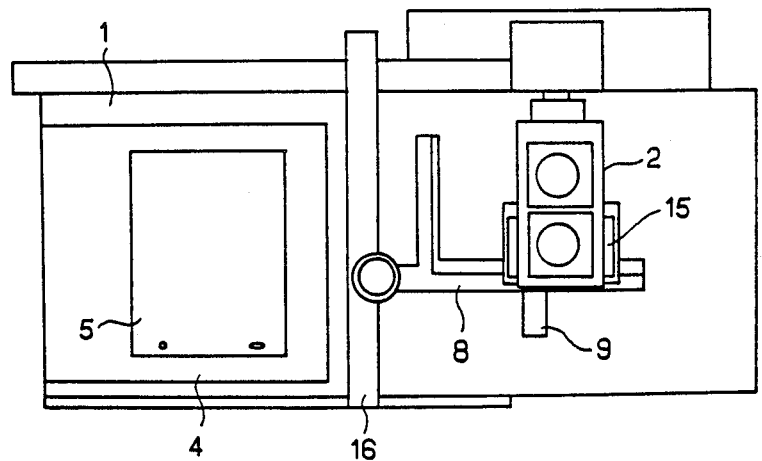
FIG. 5

FIG.4-B
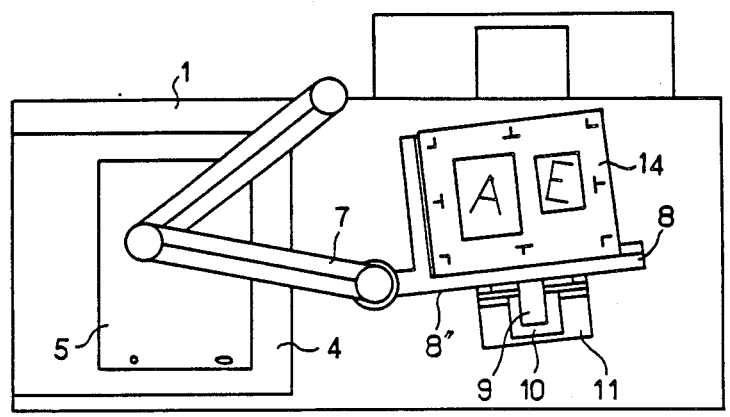
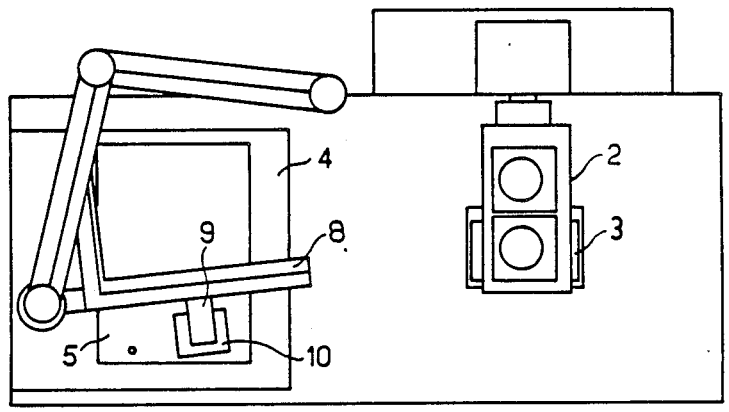
FIG.4-C
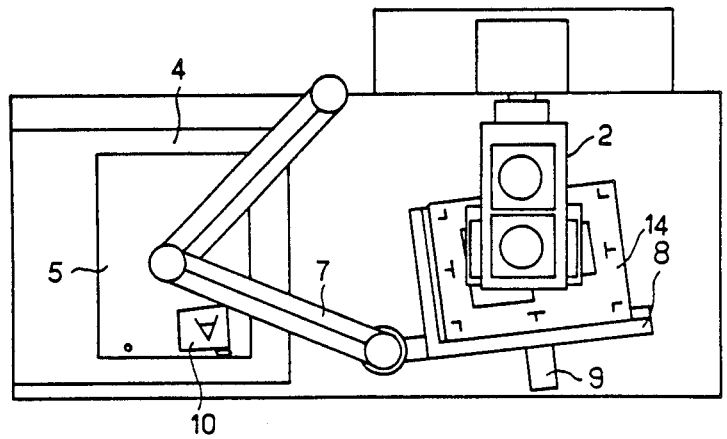
FIG.4-D

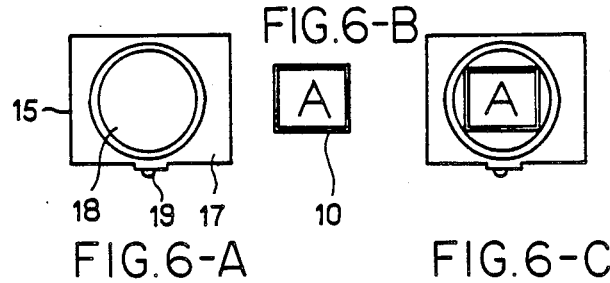
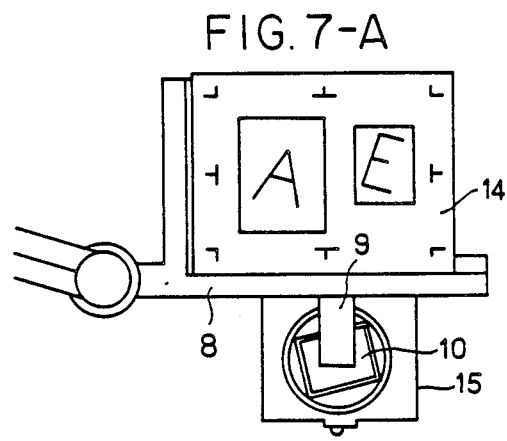
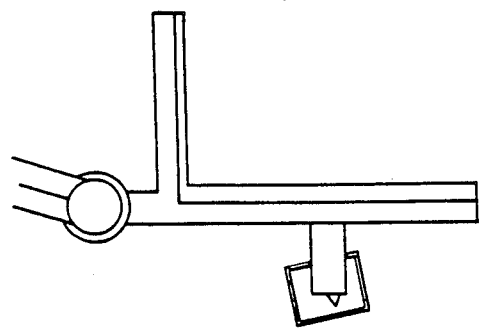

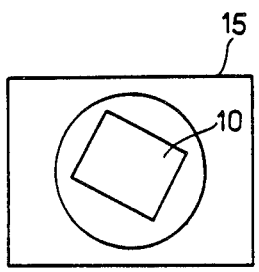
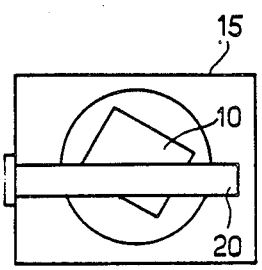
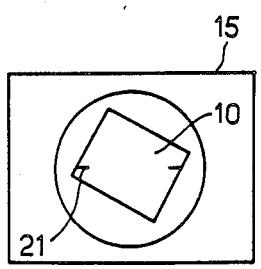
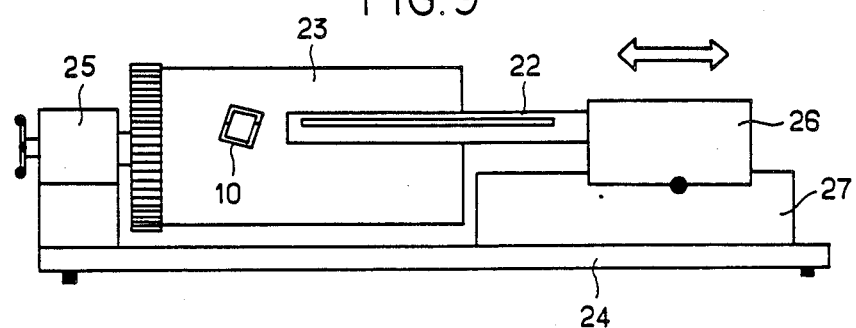
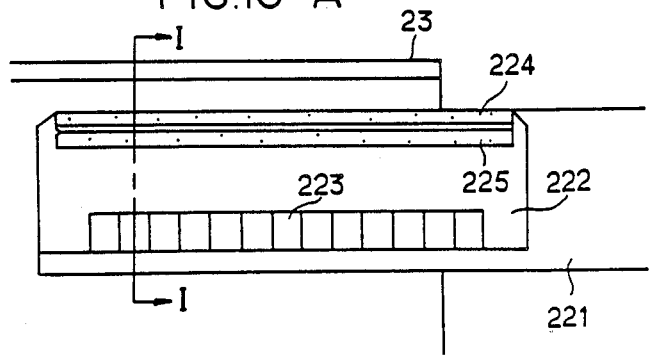
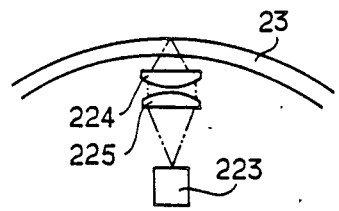

ORIGINALS PATCHING DEVICE

This application is a continuation of application Ser. No. 596,532, filed on Apr. 4, 1984, now abandoned.

BACKGROUND OF THE INVENTION

This invention relates to an original patching up device suitable for collectively patching up a plurality of originals onto a sheet film with a specified angle. Different kinds of devices for fitting originals onto an original drum for use in an image scanning and recording unit of a color scanner with a certain inclination to an axis of the drum have been proposed up to today including the applicant's proposal disclosed in Japanese Patent Application No. 54-5822 laid open under Provisional Publication No. 54-100802. According to this preceding proposal by the applicant, the originals are directly fitted onto an original cylinder with a jig which holds the originals inclined with a certain angle to the axis of the original cylinder held turnable around the axis. With a device of such arrangement, however, it is difficult to patch up plural originals collectively onto a transparent sheet with an accurate fixed angle.

Another known device of this kind was laid open in Japan under Provisional Publication No. 56-107230 (Japanese Patent Application No. 54-173745). According to this known device, an original image is projected with an enlarger type projector onto a layout paper on which a layout image of final finishing dimension is formed in order to detect a relative angle between the original and the layout image, then a standard line is ruled on either the original or on an auxiliary piece thereof according to the detected relative angle, and finally the original is patched up onto the original drum with a specified angle by the standard line to a reference line established on the original drum. However, since the reference line on the original drum is provided at one place only, a problem exists in that, with this device, it is quite difficult to fit the original with accurate angle to a position distant from the reference line. Moreover, the work process is intricate and not practical.

SUMMARY OF THE INVENTION

In view of the foregoing disadvantages of the conventional devices, it is an object of the invention to provide a novel original patching up device which enables a preliminary measurement of a magnification ratio of an original to be duplicated and also an angle setting of the original at the same time, and which ensures quick and collective patching up of a plurality of originals at any desired position on a transparent sheet to be fitted onto an original drum by a series of very simple operations.

In order to accomplish the foregoing object, there is provided an original patching up device comprising a projector which projects a focused image corresponding to an original set on an original carrier having a reference side while continuously changing projection magnification. A layout sheet holding arm is provided which holds a block copy layout sheet on the reference side parallel to said original carrier and which can move within a plane parallel to a projection surface of said projector. Further provided are an original holder on the other side parallel to the reference side of said layout sheet holding arm, and holding means which can hold a transparent sheet on the same plane as the projection surface of said projector in a specified positional relation with the reference side of said layout sheet holding arm, so that the original on the original carrier is transferred onto the transparent sheet keeping a relative angle between the original and a fixed image on the block copy layout sheet.

Other objects, features and advantages of the present invention will become apparent in the course of the following description with the accompanying drawings.

BRIEF DESCRIPTION OF THE DRAWINGS

In the accompanying drawings, forming a part of the present application and in which like parts are designated by the same reference numerals or characters throughout.

FIG. 1 is a top view showing an outline of an original patching up device of the present invention as an embodiment;

FIG. 2A is a top view showing an embodiment of an original carrier without an original fitted thereto;

FIG. 2B illustrates an original to be fitted on the original carrier;

FIG. 2C is a top view similar to FIG. 2A with an original fitted to the original carrier;

FIG. 3 is a top view showing an example of a block copy layout sheet;

FIGS. 4A–4D are top views of an essential part showing a process of collectively patching a plurality of originals each with a fixed angle, by the patching up device of the present invention;

FIG. 5 is a top view of another embodiment of the original patching device according to the present invention;

FIG. 6A is a top view showing a turning original carrier used for the embodiment of FIG. 5;

FIG. 6B is a top view of an original to be fitted on the original carrier of FIG. 6A;

FIG. 6C is a top view similar to FIG. 6A with the original fitted to the original carrier;

FIGS. 7A–7B are top views of an essential part showing a process of collectively patching a plurality of originals each with a fixed angle in the embodiment of FIG. 5;

FIG. 8A is a top view of a second application of the turning original carrier;

FIG. 8B is a top view of a third application of the turning original carrier;

FIG. 8C is a top view of a fourth application of the turning original carrier;

FIG. 9 is a front view of a reference line image projector used for pasting up of originals onto the original drum;

FIG. 10A is a longitudinal sectional plan view of a reference line image projector; and FIG. 10B is a schematic cross-sectional view taken along the line I—I in FIG. 10A.

DESCRIPTION OF THE PREFERRED EMBODIMENTS

Referring now to FIG. 1, reference numeral (1) is a base and (2) is an enlarger type projector fixed onto the base (1).

This projector (2) indicates a magnification which corresponds to a size of an image projected on a light receiving surface of the base (1) and also serves as a magnification measuring unit like the one disclosed in the Japanese Patent Publication No. 54-27253. (3) is a draft rack of the projector (2), (4) is a magnetic sheet fixed onto the base (1), (5) is a transparent sheet used for patching up, i.e., a Mylar sheet to be placed onto the magnetic sheet (4), (7) is a free arm one end of which is fixed to the base (1) and also pivoted to another arm (6) which is mounted so as to turn freely within the same plane as the arm (7), and an L-shaped layout sheet holding arm (8) is fixed to the other end of said free arm (7). (9) is an original holder fixed to be projected at a right angle to one side of the layout sheet holding arm (8) within the same plane as the layout sheet holding arm (8). To hold the originals temporarily, an adhesive agent of untransferable property, for example, is applied to the base (1) side of the original holder (9). Such means for holding the originals onto the original holder (9) is not only limited to adhesive agents, but taping at the top of the original holder or vacuum suction is also applicable as a matter of course.

According to the original patching up device of the present invention, originals are patched up onto the transparent sheet (5) at a specified angle in the following procedure.

First, an original (10) as shown in FIG. 2 (b) is placed onto an original carrier (11), such as a glass plate, on which reference lines serving as a guide for the projection position of the original (10) are marked as shown in FIG. 2 (a) while keeping a film surface of the original facing up, then a side of the original (10) is fixed along one of the marked reference lines as shown in FIG. 2 (c) by taping or the like.

After holding the original (10) on the original carrier (11) between it and another transparent plate such as glass plate, said original (10) is brought into contact with a reference edge (11') of the original carrier, i.e. the innermost part of the draft rack (3) of said projector, and is set with the film surface facing downward. Then a block copy layout sheet (14), on which trimming figures (square, circle etc.) of a plurality of duplicated images (13) (13') corresponding to a plurality of originals are arranged at a specified magnification as well as a specified layout as shown, for example, in FIG. 3, is attached to the layout sheet holding arm (8) with register pins or other adequate means as shown in FIG. 4 (A). In FIG. 4-A and 4-B, the projector (2) is omitted for the sake of easier understanding of the drawings.

A reference side (8') of the layout sheet holding arm (8) to which the block copy layout sheet (14) is attached, a side (8'') of the layout sheet holding arm (8) with which the original carrier (11) is put in contact when the original (10) is transferred from the original carrier (11) to the original holder (9) as described later, and positioning and holding means such as register pins to place the transparent sheet (5) onto the magnetic sheet (4) are respectively adjusted in advance so that they are kept parallel to each other when a setting angle of the layout sheet holding arm (8) is turned to zero.

Then the image of the original (10) is projected by the projector (2) while changing the projection magnification, then the layout sheet holding arm (8) is turned within the light receiving surface of the base (1) to coincide a contour of the projected image with that of the specified image on the block copy layout sheet (14), and finally the turning of the layout sheet holding arm (8) is set.

In this case, the projection magnification digitally indicated on the projector may also be used, for example, as a duplication magnification when duplicated images are recorded by a layout scanning system. Then the original carrier (11) set on the draft rack (3) of the projector (2) is taken out, and is put in contact with the side (8'') of the layout sheet holding arm (8) so that the original (10) held on the original carrier (11) may correspond to the original holder (9) as shown in FIG. 4-B, and then the original holder (9) is slightly pushed down to hold the original (10) by an untransferable adhesive applied to the underside of the original holder.

After taking the block copy layout sheet (14) from the layout sheet holding arm (8), the layout sheet holding arm (8) is moved to a specified position on the transparent sheet (5) positioned and placed with register pins on the magnetic sheet (4) as shown in FIG. 4-C, and then the layout sheet holding arm (8) is fixed by the magnetic force of the magnetic sheet (4). When the original (10) held by the original holder (9) is fixed onto the transparent sheet (5) by taping or the like and the original holder is pulled up a little, the original (10) is easily released from the adhesive and is patched up onto a desired position on the transparent sheet (5) with a specified angle.

Then the block copy layout sheet (14) is attached to the layout sheet holding arm (8) as shown in FIG. 4-D. After projecting the image corresponding to the next original (10) projected by the projector (2) in the same manner as described above and measuring the duplicating magnification of the original (10), the original (10) is patched up onto the transparent sheet (5) at a desired position with a specified angle. By repeating the same procedure thereafter, a plurality of originals are patched up onto the transparent sheet one by one with a specified angle.

FIG. 5 is a top view showing the outline of another embodiment of the original patching up device according to the present invention. In this embodiment, the original carrier is of a rotary type and is so composed that the projected image can be turned while mounting the original carrier on the draft rack of the projector (2). As there is no need to turn the layout sheet holding arm (8) unlike the case of the foregoing first embodiment, the original can be moved in a parallel manner to a desired position on a transparent sheet (15) by means of an X-Y rail (16).

The rotary type original carrier (15) used in this embodiment is as shown in FIG. 6 (a), for example, and is composed of a carrier plate (17), a transparent rotary glass plate (18) turning relatively to said carrier plate (17) on the same plate, and a rotary dial (19) for turning said rotary glass plate (18) relatively to the carrier plate (17).

In this embodiment, therefore, the original (10) as shown in FIG. 6 (b) is first fixed by taping on the rotary glass plate (18) of the rotary original carrier (15) as illustrated in FIG. 6 (c), and then is set on the draft rack of the projector (2). After attaching to the layout sheet holding arm (8) in the same manner as described above and moving in parallel so that the image at the specified position on the block copy layout sheet (14) may come to the light receiving surface of the projector (2), the rotary dial (9) of the rotary original carrier (15) is adjusted while changing the image projection magnification so as to coincide the contour of a specific image on the block copy layout sheet (14) with the contour of the projected image, and then measurement of the duplication magnification of the specific image on the block copy layout sheet (14) and also angle setting of the original (10) are performed at the same time. At this time, the projection magnification is also indicated on the projector (2) in the same manner as the first embodiment.

After that, the rotary original carrier (15) is taken out of the draft rack of the projector (2), and the rotary original carrier (15) is put in contact with the opposite side of the sheet holding side of the layout sheet holding arm (8) so that the original (10) may be opposed to the original holder (9) of the layout sheet holding arm (8) as shown in FIG. 7-A. Then the original holder (9) is pushed down slightly so that the original (10) may be also held by the original holder (9), and the tape fixing the original (10) onto the rotary glass plate (18) of the rotary original carrier (15) is taken off. Thus the original (10) is held by the original holder (9) while keeping a specified angle (FIG. 7-B). Then the layout sheet holding arm (8) is moved in a parallel manner to the specified position on the transparent sheet (5), and after the layout sheet holding arm (8) is temporarily fixed by the magnetic force of the magnetic sheet (4) in the same manner as for the first embodiment, the original (10) is fixed to a specified position of the transparent sheet (5) by taping or the like. Thereafter the same procedure is repeated to each original on the block copy layout sheet (14) to complete the collective patching up.

As a further method, it is possible to directly patch up each original onto the original drum at a specified angle by using the rotary original carrier as disclosed in the second embodiment and a reference line projector (22) for patching up. For example, a marking-off line (21) is set, as shown in FIG. 8-(c), outside of an effective image area of the original (10) with a specified angle on the rotary original carrier (15) as shown in FIG. 8-(a), by using a ruler (20) as shown in FIG. 8-(b).

Then, the reference line is projected onto the periphery of an original drum (23) by using the reference line projector (22) for patching as shown in FIG. 9 and the marking-off line on the original (10) is fitted to said reference line. Thus the original (10) can be patched up at any desired position on the original drum (23) with a specified angle. In FIG. 9, numeral (25) is a bearing installed vertically on a base (24) to support the original drum (23) of cantilever type to turn freely, and (26) is a sliding carriage which moves in the axial direction of the original drum (23) on a fixed base (27).

Referring now to FIG. 10 showing an enlargement of an essential part of the reference line projector (22), a holding plate (222) is fixed onto a side plate (221) which is fixed onto said sliding carriage (26) at one end, and on said holding plate (222), the LED array (223) with a number of light emitting diodes arranged linearly, and a pair of cylindrical lenses (224), (225) are arranged in a specified positional relation so that a light image of said LED array (223) may be focused on the original drum (23).

Consequently, since the reference line can be projected at any desired position on the original drum (23), it is possible to patch-up the original (10) marked as shown in FIG. 8-(c) at any desired position on the original drum (23) without difficulty for angle setting.

While the above-described embodiments represent the preferred forms of the present invention, it is to be understood that modifications thereof will occur to those skilled in the art without departing from the spirit of the present invention. The scope of the present invention, therefore, is to be determined solely by the appended claims.

We claim:

1. An original patching up device comprising:
a projector provided so as to project a focused image corresponding to an original image on an original carrier having a reference side while continuously changing projection magnification, said projector being equipped with a draft rack having a contact side contactable with the reference side of the original carrier which charges said original carrier in a detachable manner;
a layout sheet holding arm provided so as to hold a block copy layout sheet on a reference side and move within a plane parallel to a projection surface of said projector, said layout sheet holding arm having a side parallel to its reference side which is contactable with the reference side of the original carrier when taken out of the draft rack of the projector;
an original holder provided so as to project perpendicularly from another side of said layout sheet holding arm parallel to the reference side, said original holder having means for releasably holding an original after transference of the original from the original carrier; and means for holding a transparent sheet on the same plane as the projection surface of said projector in a specified positional relation to the reference side of said layout sheet holding arm, so that the original on the original carrier is transferred onto the transparent sheet keeping a relative angle between the original and an image on the block copy layout sheet.

2. An original patching up device as defined in claim 1, wherein the layout sheet holding arm is provided so as to turn within the same plane as the projection surface.

3. An original patching up device as defined in claim 1, wherein the original carrier is formed so that the original on said original carrier is turnable so as to keep the original carrier mounted onto the draft rack of the projector.

* * * * *